United States Patent
Lee et al.

(10) Patent No.: US 10,590,542 B2
(45) Date of Patent: Mar. 17, 2020

(54) METHOD FOR FORMING COATING HAVING COMPOSITE COATING PARTICLE SIZE AND COATING FORMED THEREBY

(71) Applicant: IONES CO., LTD., Gyeonggi-do (KR)

(72) Inventors: Mun Ki Lee, Gyeonggi-do (KR); Byung Ki Kim, Gyeonggi-do (KR); Jae Hyuk Park, Gyeonggi-do (KR); Dae Gean Kim, Gyeonggi-do (KR); Myoung No Lee, Gyeonggi-do (KR)

(73) Assignee: IONES CO., LTD., Gyeonggi-do (KR)

( * ) Notice: Subject to any disclaimer, the term of this patent is extended or adjusted under 35 U.S.C. 154(b) by 220 days.

(21) Appl. No.: 15/112,079

(22) PCT Filed: Dec. 4, 2014

(86) PCT No.: PCT/KR2014/011795
§ 371 (c)(1),
(2) Date: Jul. 15, 2016

(87) PCT Pub. No.: WO2015/108276
PCT Pub. Date: Jul. 23, 2015

(65) Prior Publication Data
US 2016/0333471 A1    Nov. 17, 2016

(30) Foreign Application Priority Data
Jan. 17, 2014 (KR) .......... 10-2014-0006146
Jan. 17, 2014 (KR) .......... 10-2014-0006147
(Continued)

(51) Int. Cl.
*C23C 24/04* (2006.01)
*C23C 16/06* (2006.01)
(Continued)

(52) U.S. Cl.
CPC .......... *C23C 24/04* (2013.01); *C04B 35/447* (2013.01); *C04B 35/505* (2013.01);
(Continued)

(58) Field of Classification Search
CPC .................................... C23C 24/04
See application file for complete search history.

(56) References Cited

U.S. PATENT DOCUMENTS

| 4,963,291 A | * | 10/1990 | Bercaw | C08K 3/18 |
| | | | | 252/512 |
| 2001/0009118 A1 | * | 7/2001 | Hosoe | B22F 9/24 |
| | | | | 75/255 |

(Continued)

FOREIGN PATENT DOCUMENTS

| CN | 102912279 | | 2/2013 | |
| JP | H10273609 A | * | 10/1998 | ............... C09D 5/23 |

(Continued)

OTHER PUBLICATIONS

International Search Report dated Jan. 7, 2015 for PCT/KR2014/011795.
(Continued)

*Primary Examiner* — Michael P. Rodriguez

(57) ABSTRACT

The present invention discloses the method for forming the coating having the composite coating particle size and the coating formed thereby, comprising the steps of: receiving, from a powder supply portion, a plurality of powders within a first powder particle size range, and transporting the powders using a transport gas; and forming a coating in which a plurality of first particles within a first coating particle size range and a plurality of second particles within a second coating particle size range, which is larger than the first coating particle size range, by causing the transported
(Continued)

powders to collide with a substrate inside a process chamber at the speed of 100 to 500 m/s so as to be pulverized.

10 Claims, 10 Drawing Sheets

(30) Foreign Application Priority Data

Jan. 17, 2014 (KR) .................. 10-2014-0006148
Jan. 17, 2014 (KR) .................. 10-2014-0006149

(51) Int. Cl.
*C04B 35/447* (2006.01)
*C04B 35/505* (2006.01)
*C04B 35/622* (2006.01)
*C23C 16/44* (2006.01)
*C23C 16/458* (2006.01)
*H01J 37/32* (2006.01)

(52) U.S. Cl.
CPC ........ *C04B 35/62222* (2013.01); *C23C 16/06* (2013.01); *C23C 16/4404* (2013.01); *C23C 16/4581* (2013.01); *H01J 37/32495* (2013.01); *C04B 2235/5436* (2013.01)

(56) References Cited

U.S. PATENT DOCUMENTS

| 2008/0108225 | A1 | 5/2008 | Sun et al. |
| 2008/0242529 | A1* | 10/2008 | Luo ............... A61L 27/425 501/80 |

FOREIGN PATENT DOCUMENTS

| JP | 2003-208901 | 7/2003 |
| JP | 2008-106363 | 5/2008 |
| JP | 2011-208166 | 10/2011 |
| JP | 2012-243629 | 12/2012 |
| KR | 10-2009-0112657 | 10/2009 |
| KR | 10-2009-0123620 | 12/2009 |
| KR | 10-1075993 | 10/2011 |
| KR | 10-2012-0100697 | 9/2012 |

OTHER PUBLICATIONS

Office Action dated Jul. 26, 2016 corresponding to Japanese Application No. 2015-557963, 4 pages.
Office Action dated Feb. 2, 2018 corresponding to Chinese Application No. 201480075369.7, 10 pages.

* cited by examiner

Ra 1um      Ra 2~3um

METHOD FOR FORMING COATING HAVING COMPOSITE COATING PARTICLE SIZE AND COATING FORMED THEREBY

This application claims the priority of Korean Patent Application Nos. 10-2014-0006146, 10-2014-0006147, 10-2014-0006148, and 10-2014-0006149, filed on Jan. 17, 2014 in the KIPO (Korean Intellectual Property Office), the disclosure of which is incorporated herein entirely by reference. Further, this application is the National Stage application of International Application No. PCT/KR2014/011795, filed Dec. 4, 2014, which designates the United States and was published in Korean. Each of these applications is hereby incorporated by reference in their entirety into the present application.

TECHNICAL FIELD

The present invention relates to a forming method of a coating layer having a multi coating grain size and a coating layer thereof.

BACKGROUND ART

Currently, a spray coating process is widely used on a commercial basis. The most distinguished characteristic of the spray coating process lies in that a high melting point ceramic or metallic material is spray-coated on a base material through rapid phase transition, enabling coating to a thickness of several micrometers to several millimeters when conditions of an operating process are optimized, and enabling 3D coating during spray coating of various base materials. The spray coating process exhibits high reliability in the field of chemical resistance and abrasion resistance on the basis of the excellent properties and is widely adopted in various fields including aerospace, semiconductors, mechanical ships, and so on.

DISCLOSURE OF THE INVENTION

Technical Problem

Embodiments of the present invention provide a forming method of a coating layer having a multi coating grain size and a coating layer thereof, in which porosity is relatively low (or compactness is relatively high), surface micro cracks are absent, and powder control is facilitated.

Embodiments of the present invention also provide a forming method of a coating layer having a multi coating grain size and a coating layer thereof, in which the laminating speed is relatively high, semi-transparency is provided, and material characteristics can be easily realized.

Technical Solution

According to an aspect of the present invention, there is provided a forming method of a coating layer having a multi coating grain size, the forming method including receiving powder including multiple grains having a powder grain size scale from a powder supply unit and transporting the powder using a transporting gas; and allowing the transported powder to collide with a base material provided in a processing chamber at a speed of 100 to 500 m/s to then be pulverized and forming a coating layer having multiple first and second particles mixed therein, the multiple first particles having a first coating grain size and the second particles having a second coating grain size, wherein the first coating grain size of the first particles ranges from 200 nm to 900 nm, and the second coating grain size of the second particles ranges from 900 nm to 10 μm.

Here, the first powder grain size of the powder grains may range from 0.1 μm to 50 μm. The maximum number of the first particles may exist between 250 nm and 350 nm in the first grain size scale and the maximum number of the second particles may exist between 1.0 μm and 1.2 μm in the second grain size scale. The maximum number of the first particles may be greater than the maximum number of the second particles. The porosity of the coating layer may be in the range of 0.01% to 1.0%. The cross-sectional ratio of the first particles to the second particles may be in the range of 9:1 to 5:5.

In the forming of the coating layer, the transport gas or the base material may be maintained at a temperature in the range of 0° C. to 1000° C.

The powder may be a brittle material or a flexible material.

The powder may be one element or a mixture of two elements selected from the group consisting of yttrium-based oxide, $Y_2O_3$—$Al_2O_3$-based compound, AlN, $Si_3N_4$, TiN, $B_4C$, $ZrO_2$, $Al_2O_3$, $Ca_{10}(PO_4)_6(OH)_2$, bio glass, crystallized glass precipitated in a glass matrix by heat treatment and titanium dioxide.

According to another aspect of the present invention, there is provided a coating layer coating layer formed using powder having a powder grain size ranging from 0.1 μm to 50 μm, the coating layer including multiple first particles having a first coating grain size; and multiple second particles having a second coating grain size, wherein the multiple first and second particles are mixed to then be coated on a base material to form a coating layer, the first coating grain size of the first particles ranges from 200 nm to 900 nm, and the second coating grain size of the second particles ranges from 900 nm to 10 μm.

The maximum number of the first particles may exist between 250 nm and 350 nm in the first grain size scale and the maximum number of the second particles may exist between 1.0 μm and 1.2 μm in the second grain size scale. The maximum number of the first particles may be greater than the maximum number of the second particles. The porosity of the coating layer may be in the range of 0.01% to 1.0%. The cross-sectional ratio of the first particles to the second particles may be in the range of 9:1 to 5:5.

The powder may be a brittle material or a flexible material.

The first and second particles may include one element or a mixture of two elements selected from the group consisting of yttrium-based oxide, $Y_2O_3$—$Al_2O_3$-based compound, AlN, $Si_3N_4$, TiN, $B_4C$, $ZrO_2$, $Al_2O_3$, $Ca_{10}(PO_4)_6(OH)_2$, bio glass, crystallized glass precipitated in a glass matrix by heat treatment and titanium dioxide.

The base material may be a component exposed to a plasma environment, instrument inserted into human body, a substrate or a heat sink for a light emitting diode (LED), a substrate or a heat sink for an electronic control unit (ECU) of a vehicle, a substrate or a heat sink for a spark module of a vehicle, a substrate or a heat sink for a power semiconductor module, a substrate or a heat sink for a power converter, or a heat dissipating substrate for a fuel cell.

The component may be an internal component of a processing chamber for manufacturing a semiconductor or a display.

The component may include one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, a mask frame and equivalents thereof.

The instrument inserted into human body may be a fixture for an implant or an artificial joint.

Advantageous Effects

As described above, in the method for forming a coating layer having a multi coating grain size and the coating layer thereof according to an embodiment of the present invention, porosity is relatively low (or compactness is relatively high), surface micro cracks are absent, and powder control is facilitated.

In addition, in the method for forming a coating layer having a multi coating grain size according to an embodiment of the present invention, and the coating layer thereof, the laminating speed is high, semi-transparency is provided, and material characteristics can be easily realized.

Further, in the method for forming a coating layer having a multi coating grain size according to an embodiment of the present invention, and the coating layer thereof, plasma resistance can be improved.

Moreover, in the method for forming a coating layer having a multi coating grain size according to an embodiment of the present invention, and the coating layer thereof, hardness and adhesive strength characteristics can be improved.

Additionally, in the forming method of a coating layer having a multi coating grain size according to an embodiment of the present invention, and the coating layer thereof, material characteristics are provided in view of purity and crystallinity without phase transition during a coating forming process and high surface roughness is demonstrated, thereby increasing a degree of bio activation.

In addition, in the forming method of a coating layer having a multi coating grain size according to an embodiment of the present invention, and the coating layer thereof, withstand voltage characteristics (or insulation characteristics) and heat dissipation performance are improved.

MODE FOR CARRYING OUT THE INVENTION

Figure 1:
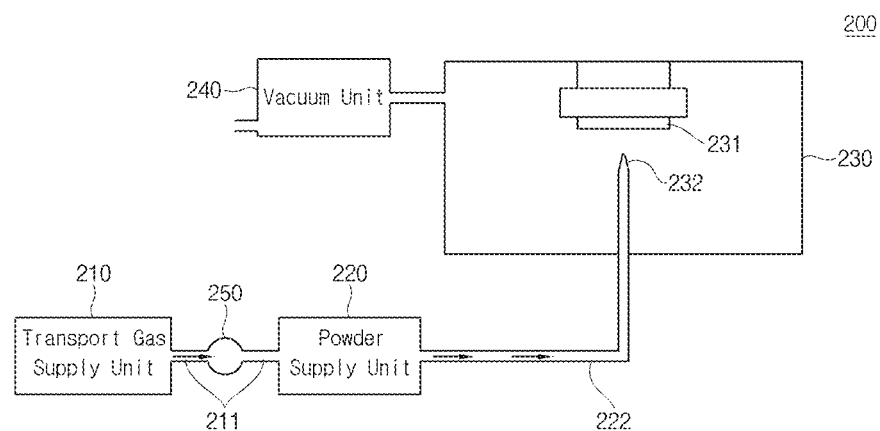
FIG. 1 is a schematic diagram illustrating an apparatus for forming a coating layer having a multi coating grain size according to an embodiment of the present invention.

Hereinafter, examples of embodiments of the invention will be described in detail with reference to the accompanying drawings such that they can easily be made and used by those skilled in the art.

The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the drawings, the thickness of layers and regions are exaggerated for clarity. As used herein, the term "and/or" includes any and all combinations of one or more of the associated listed items.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer, and/or section from another. Thus, for example, a first member, a first element, a first region, a first layer and/or a first section discussed below could be termed a second member, a second element, a second region, a second layer and/or a second section without departing from the teachings. In addition, throughout the specification of the present invention, it is noted that the term "powder" is used in case where a coating layer is yet to be formed and the term "grain" is used in case where a coating layer is formed. In addition, the term "mode or modal value" as one of statistics representing central tendency of data means a value of most frequently occurring data.

Figure 2:
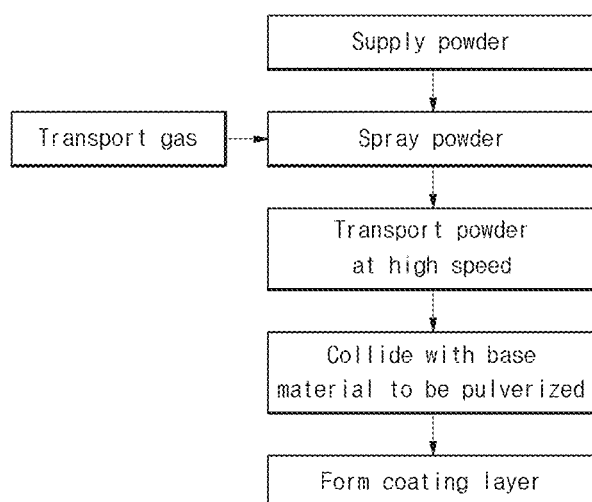
FIG. 2 is a flow chart illustrating a forming method of a coating layer having a multi coating grain size according to an embodiment of the present invention.

FIG. 1 is a schematic diagram illustrating an apparatus for forming a coating layer having a multi coating grain size according to an embodiment of the present invention, and FIG. 2 is a flow chart illustrating a forming method of a coating layer having a multi coating grain size according to an embodiment of the present invention.

As illustrated in FIG. 1, the coating layer forming apparatus 200 according to the present invention includes a transport gas supply unit 210, a powder supply unit 220 storing and supplying powder, a transport pipe 222 transporting the powder from the powder supply unit 220 using a transport gas, a nozzle 232 coating/stacking or spraying the powder from the transport pipe 222 on a base material 231, and a processing chamber 230 allowing the powder from the nozzle 232 to collide with a surface of the base material 231, to be crushed and/or pulverized to form a coating layer having a predetermined thickness.

The coating layer forming method according to the present invention will now be described with reference to FIGS. 1 and 2.

The transport gas stored in the transport gas supply unit 210 may include one element or a mixture of two elements selected from the group consisting of oxygen, helium, nitrogen, argon, carbon dioxide, hydrogen and equivalents thereof, but aspects of the present invention are not limited thereto. The transport gas is directly supplied from the transport gas supply unit 210 to the powder supply unit 220 through a pipe 211, and the flow rate and pressure of the transport gas may be controlled by a flow rate controller 250.

The powder supply unit 220 stores and supplies a large amount of powder. The powder may have a grain size in the range of approximately 0.1 μm to approximately 50 μm. As an example, the powder may have a first grain size scale and a first modal value and may demonstrate a similar characteristic to a normal distribution.

If the powder grain size scale is smaller than approximately 0.1 μm, it is difficult to store and supply powder. In addition, due to cohesion occurring during storage and supply of powder, a powder compact in which grains having sizes smaller than 0.1 μm are conglomerated when the powder is sprayed and the powder collides with a base material and is crushed and/or pulverized, may be readily formed. Moreover, it is also difficult to form a coating layer having a relatively large area.

In addition, if the powder grain size scale is larger than approximately 50 μm, a sand blasting phenomenon is likely to occur when the powder is sprayed and the powder collides with a base material and is crushed and/or pulverized. Since even a partly formed coating layer has a relatively large powder grain size scale, the coating layer becomes unstable and the porosity of the interior or surface of the coating layer may increase, material characteristics may not be properly realized.

If the powder grain size scale is between approximately 0.1 μm and approximately 50 μm, it is possible to obtain a coating layer having a multi coating grain size, in which the porosity is relatively small (or the compactness is relatively large), surface micro cracks are absent, and powder control is facilitated. In addition, if the powder grain size scale is between approximately 0.1 μm and approximately 50 μm, it is possible to obtain a coating layer having a multi coating grain size, in which the laminating speed of the coating layer is relatively high, semi-transparency is provided, and material characteristics can be easily realized. The powder may be a brittle material or/and a flexible material. The brittle material is easily cracked and rarely elastic and may include ceramic, glass and the like. In addition, the flexible material may be a readily elastic, unlike the brittle material, and may include copper, lead and the like.

In detail, the powder as a brittle material may include one element or a mixture of two elements selected from the group consisting of yttria ($Y_2O_3$), YAG ($Y_3Al_5O_{12}$), rare earth metal based (elements of element Nos. 57 to 71, including Y and Sc) oxide, alumina ($Al_2O_3$), bio glass, silicon dioxide ($SiO_2$), hydroxyapatite ($Ca_{10}(PO_4)_6(OH)_2$), titanium dioxide ($TiO_2$) and equivalents thereof, but aspects of the present invention are not limited thereto.

In more detail, the powder as a brittle material or a flexible material may include one element or a mixture of two elements selected from the group consisting of hydroxyapatite ($Ca_{10}(PO_4)_6(OH)_2$), calcium phosphate, bio glass, $Pb(Zr,Ti)O_3$(PZT), alumina ($Al_2O_3$), titanium dioxide ($TiO_2$), zirconia ($ZrO_2$), yttria ($Y_2O_3$), yttria stabilized zirconia (YSZ), Dysprosia ($Dy_2O_3$), Gadolinia ($Gd_2O_3$), Ceria ($CeO_2$), Gadolinia doped Ceria (GDC), magnesia (MgO), barium titanate ($BaTiO_3$), nickel manganate ($NiMn_2O_4$), potassium sodium niobate ($KNaNbO_3$), bismuth potassium titanate ($BiKTiO_3$), bismuth sodium titanate ($BiNaTiO_3$), $CoFe_2O_4$, $NiFe_2O_4$, $BaFe_2O_4$, $NiZnFe_2O_4$, $ZnFe_2O_4$, $MnxCo_{3-x}O_4$ (where x is a solid number of 3 or less), bismuth ferrite ($BiFeO_3$), bismuth zinc niobate ($Bi_{1.5}Zn_1Nb_{1.5}O_7$), lithium phosphate aluminum titanium glass ceramic, Li—La—Zr—O-based Garnet oxide, Li—La—Ti—O-based Perovskite oxide, La—Ni—O-based oxide, lithium iron phosphate, lithium-cobalt oxide, Li—Mn—O-based Spinel oxide (lithium manganese oxide), lithium phosphate aluminum gallium oxide, tungsten oxide, tin oxide, nickel acid lanthanum, lanthanum-strontium-manganese oxide, lanthanum-strontium-iron-cobalt oxide, silicate-based phosphor, SiAlON-based phosphor, aluminum nitride, silicon nitride, titanium nitride, AlON, silicon carbide, titanium carbide, tungsten carbide, magnesium boride, titanium boride, metal oxide-metal nitride mixture, metal oxide-metal carbide mixture, ceramic-polymer mixture, ceramic-metal mixture, nickel, copper, silicon, and equivalents thereof, but aspects of the present invention are not limited thereto.

Here, the hydroxyapatite may be one element or a mixtures of two elements selected from the group consisting of dicalcium phosphate dihydrate (DCPD) ($CaHPO_4.2H_2O$), dicalcium phosphate anhydrate (DCPA) ($CaHPO_4$), octacalcium phosphate (OCP) ($Ca_4H(PO_4)_3.5/2H_2O$), β-Tcalcium phosphate (β-TCP) ($β-Ca_3(PO_4)_2$), α-Tcalcium phosphate (α-TCP) (α-Ca$_3$(PO$_4$)$_2$), tetracalcium phosphate (Te-CP) (Ca$_4$O(PO)$_2$) and equivalents thereof, but aspects of the present invention are not limited thereto.

Figure 3:
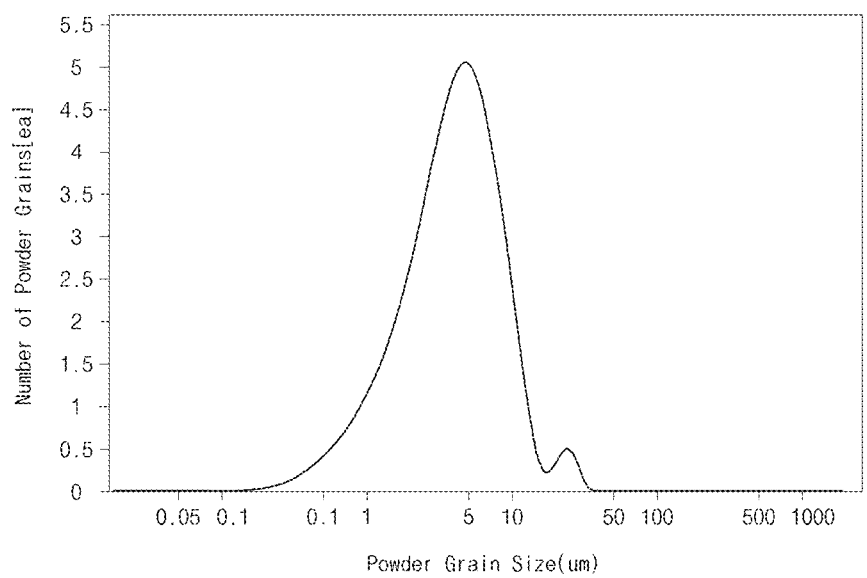
FIG. 3 is a graph illustrating a grain size distribution of powder according to an embodiment of the present invention.

FIG. 3 is a graph illustrating a grain size distribution of powder according to an embodiment of the present invention. Grain size characteristics of powder will now be described in more detail with reference to FIG. 3. In FIG. 3, the X axis indicates powder grain size (μm), represented on a log scale, and the Y axis indicates the number (ea) of powder grain sizes (nm) or the ratio (%) of powder grain sizes (nm).

The powder grain size is analyzed by laser diffraction. An example of equipment for measuring a powder grain size is LS 13 320 manufactured by Beckman Coulter Inc.

In more detail, the method of analyzing the powder grain size will now be described. First, powder is added to a solvent, such as water, to be diluted into a suspension having a concentration of approximately 10% to yield a slurry. Then, the slurry is subjected to a treatment using ultrasonic wave or a rotor to uniformly disperse the powder. Next, laser beams are applied to the powder in the dispersed slurry state while circulating the slurry powder. Here, the intensity of the laser beams passing through the powder and scattered is measured to analyze the powder grain size. The scope of powder analysis may vary according to the model of the analyzing equipment used, but is generally in the range of approximately 0.017 μm to approximately 2,000 μm.

As illustrated in FIG. 3, the powder may have a first grain size scale and a first modal value. In more detail, the first grain size scale of the powder may range from 0.1 μm to 25 μm and the first modal value of the powder may be in the range of between approximately 1 μm and approximately 10 μm.

As an example, the maximum number of the first modal value of the powder may be smaller than approximately 5 (or 5%) and the maximum number of the second modal value of the powder may be smaller than approximately 0.5 (or 0.5%)

Practically, if the first and second grain size scales, the first and second modal values, and the maximum numbers (proportions) are beyond the numeral values stated above, it is difficult to obtain coating layer having a porosity of 0.01% to 1.0%, which will be described below.

As an example, if a coating layer is formed using only the powder having a smaller grain size scale than approximately 0.1 μm, the power itself has a relatively small grain size scale. Thus, the coating layer has good transmittance and a low porosity. However, the laminating speed of the coating layer is relatively low and the powder grains are conglomerated, making it difficult to achieve powder control.

As another example, if a coating layer is formed using the powder having a larger grain size scale than approximately 50 μm, the power itself has a relatively large grain size scale. Thus, the laminating speed of the coating layer is relatively high and the coating layer has a high porosity, making the coating layer become unstable due to surface micro cracks.

Practically, if a plasma-resistant yttrium oxide coating layer applied to a semiconductor process is formed using powder having a larger grain size scale than approximately 50 μm, in spite of high plasma-resistance of the yttrium oxide, due to an unstable microstructure generated during formation of a coating layer, pores present among coarse particles in the microstructure are large-sized and the coating layer has an increased surface area due to the pores.

Accordingly, plasma corrosion is accelerated due to corrosive gas induced into spaces among the pores, and corroded yttrium oxide particles are separated from the coating layer to act as contaminant particles.

Meanwhile, the powder may be roughly spherical, which is advantageous for high-speed transport, but aspects of the present invention are not limited thereto. The powder may also have a layered structure, a need-shaped structure or a polygonal structure.

In addition, the powder having one grain size scale and one modal value and the powder having two grain size scales and two modal values are exemplified in the above description. However, when necessary, the powder having three or more grain size scales and three or more modal values may also be employed in the present invention.

Of course, the grain size scale and the modal value of the powder used in the present invention are not limited to the first and second grain size scales and the first and second modal values. As described above, the coating layer according to the present invention may have one modal value and may be formed using the powder having a grain size scale in the range of approximately 0.1 μm to approximately 50 μm. Here, the modal value may be in the range of approximately 1 μm to approximately 10 μm, more preferably in the range of approximately 4 μm to approximately 10 μm.

Here, the powder according to the present invention may be formed by the method disclosed in Korean Patent No. 10-1075993 (Registered on Oct. 17, 2011), but aspects of the present invention are not limited thereto.

Referring again to FIGS. 1 and 2, the coating layer forming method according to the present invention will further be described.

The processing chamber 230 is maintained in vacuo during formation of the coating layer. To this end, a vacuum unit 240 may be connected to the processing chamber 230. In more detail, the processing chamber 230 may be maintained at a pressure in the range of approximately 1 Pa to approximately 800 Pa, and the powder transported by the high-speed transport pipe 222 may be in the range of approximately 500 Pa to approximately 2000 Pa. However, either way, the pressure of the high-speed transport pipe 222 should be higher than that of the processing chamber 230.

In addition, since the internal temperature of the processing chamber 230 is in the range of approximately 0° C. to approximately 30° C., it is advantageous in that a separate member for increasing or decreasing the internal temperature of the processing chamber 230 is not necessarily provided. That is to say, the transport gas or/and the base material may not be separately heated and may be maintained at a temperature in the range of approximately 0° C. to approximately 30° C.

However, in some case, for the purposes of improving the deposition efficiency and compactness of a coating layer, the transport gas or/and the base material may be heated at a temperature in the range of approximately 300° C. to approximately 1000° C. That is to say, the transport gas in the transport gas supply unit 210 or the base material 231 in the processing chamber 230 may be heated by a separate heater (not shown). The stress applied to the powder at the time of forming a coating layer can be reduced by heating the transport gas or/and the base material 231, thereby obtaining the coating layer having a small porosity and high compactness. Here, when the temperature of the transport gas or/and base material is higher than approximately 1000° C., the powder is melted to cause rapid phase transition. Accordingly, the porosity of the coating layer may be increased and the internal structure of the coating layer may become unstable. In addition, when the temperature of the transport gas or/and base material is lower than approximately 300° C., the stress applied to the powder may not be reduced.

However, the present invention does not limit the temperature range to those disclosed herein. According to the characteristic of the base material forming the coating layer, the internal temperatures of the transport gas and the base material and/or the internal temperature of the processing chamber 230 may be adjusted between 0° C. and 1000° C.

Meanwhile, as described above, a pressure difference between the processing chamber 230 and the high-speed transport pipe 222 (or the transport gas supply unit 210 or the powder supply unit 220) may be approximately 1.5 times to approximately 2000 times. If the pressure difference is smaller than approximately 1.5 times, it may be difficult to transport the powder at a high speed. If the pressure difference is larger than approximately 2000 times, the surface of the base material may be over-etched due to the presence of the powder.

The powder in the powder supply unit 220 is sprayed through the transport pipe 222 to then be transported to the processing chamber 230 at high speed according to the pressure difference between the processing chamber 230 and the transport pipe 222.

In addition, the nozzle 232 connected to the transport pipe 222 is provided in the processing chamber 230, and the powder is allowed to collide with the base material 231 at a speed of approximately 100 to approximately 500 m/s. That is to say, the powder passing through the nozzle 232 is crushed and/or pulverized by the kinetic energy obtained during transport of the powder and the collision energy generated during high-speed collision, thereby forming a coating layer having a predetermined thickness on the surface of the base material 231.

As will be described below, the powder is disintegrated into first particles having a first grain size scale and a first modal value and second particles having a second grain size scale and a second modal value, and the first and second particles are irregularly mixed with each other to be laminated on the surface of the base material 231, thereby forming the coating layer having a small porosity and high compactness.

In other words, the powder having the first grain size scale and the first modal value and having a normal distribution is allowed to collide with the base material 231 at a speed of approximately 100 to approximately 500 m/s and is crushed and/or pulverized, thereby obtaining the coating layer having a multi coating grain size, that is, the coating layer having at least two particle peaks of first particles having the first grain size scale and the first modal value and second particles having the second grain size scale and the second modal value. Here, the first grain size scale of first particles is smaller than the second grain size scale of second particles and the first modal value of first particles is smaller than the second modal value of second particles, thereby providing a coating layer structured such that sand grains having small grain sizes are positioned between gravel grains having large grain sizes, that is, a coating layer having an extremely small porosity and a high laminating/coating speed. The structure of the coating layer will be described below.

Figure 4:
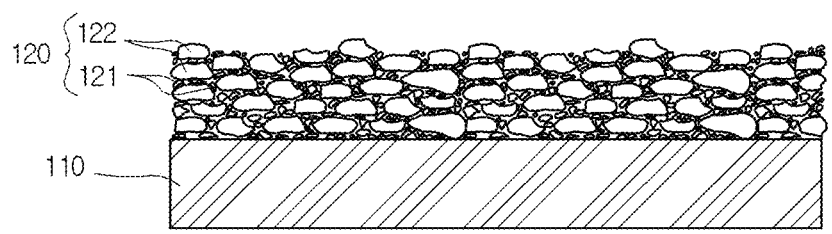
FIG. 4 is a schematic diagram illustrating a cross section of a coating layer having a multi coating grain size according to an embodiment of the present invention.
Figure 5:
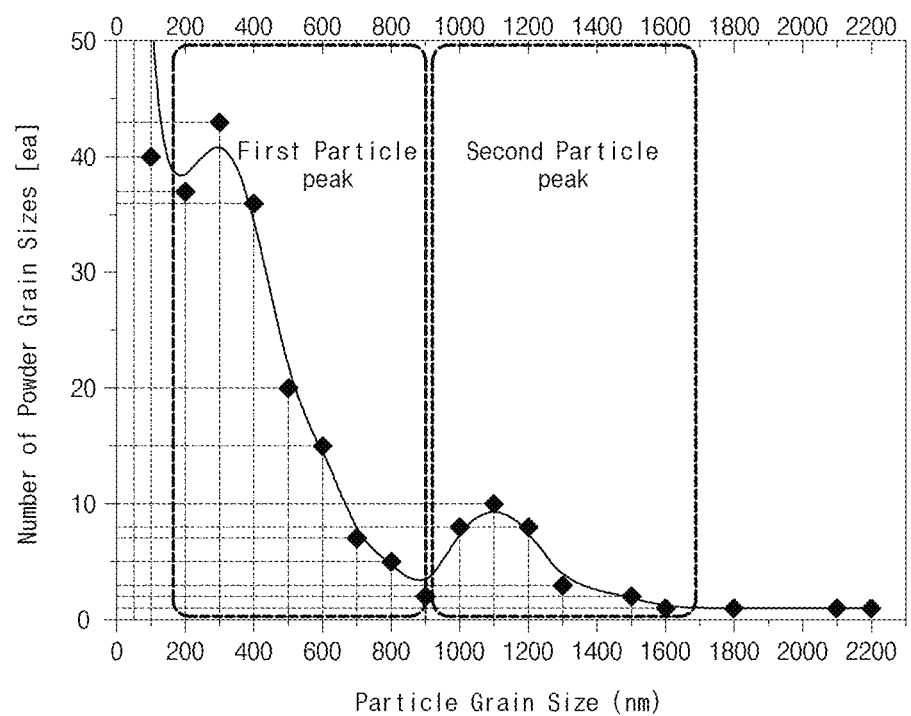
FIG. 5 is a graph illustrating grain size distributions of first and second particles in a coating layer according to an embodiment of the present invention.

FIG. 4 is a schematic diagram illustrating a cross section of a coating layer having a multi coating grain size according to an embodiment of the present invention and FIG. 5 is a graph illustrating grain size distributions of first and second particles in a coating layer according to an embodiment of the present invention. In FIG. 5, the X axis indicates the grain size (nm) of a coating layer and the Y axis indicates the number (ea) or proportion (%) of grain sizes (nm) of the coating layer. Although the grain sizes of the X axis can be represented up to 10,000 nm in FIG. 5, the graph of FIG. 5 is abbreviated for the sake of convenience.

Here, the grain sizes of first and second particles forming the coating layer are analyzed by a scanning electron microscope (SEM), e.g., SNE-4500M equipment. In more detail, the method of analyzing the coating grain size will now be described. First, a specimen having a coating layer to be analyzed is cut to obtain a cross section and the cross section is grinded. Next, the coating layer is photographed using the SEM and a photographed image of the coating layer is processed by image processing software to analyze grain sizes of the first and second particles. In the present invention, the cross section of the coating layer having a sectional area of approximately 110 μm2 was photographed to analyze the grain sizes of first and second particles. In addition, the numbers of first and second grain sizes in the range of approximately 50 nm to approximately 2200 nm were obtained by calculating lengths of longest axes of the first and second particles. However, second particles having a grain size of 10 μm or less were observed.

As illustrated in FIGS. 4 and 5, the coating layer 120 having a multi coating grain size according to the present invention includes a plurality of first particles 121 and a plurality of second particles 122 formed on the surface of the base material 110, the first particles 121 having a first grain size and the second particles 122 having a second grain size different from the first grain size and disposed between each of the plurality of first particles 121. That is to say, the coating layer 120 according to the present invention is configured such that the first particles 121 having a relatively small grain size compactly filled in crevices, spaces or gaps created in the second particles 122 having a relatively large grain size.

In more detail, the first particles 121 have a first grain size scale and a first modal value and the second particles 122 have a second grain size scale larger than the first grain size scale and a second modal value larger than the first modal value. In addition, the first particles 121 and the second particles 122 are mixed with each other and are laminated/coated on the base material, thereby forming the coating layer having a small porosity and compactness.

In more detail, the first grain size scale of the first particles 121 ranges from approximately 1 nm to approximately 900 nm, and the first modal value of the first particles 121 ranges from approximately 250 nm to approximately 800 μm, preferably from approximately 250 nm to approximately 350 nm, but not limited thereto. As an example, the first modal value of the first particles 121 may be slightly smaller or larger than the grain size scales stated above.

Here, the first particles 121 demonstrate similar features to a normal distribution in the range of approximately 200 nm to approximately 900 nm with regard to the first modal value of the first particles 121 (between 250 nm and 800 nm). However, the first particles 121 having a smaller size than 200 nm predominantly exist. That is to say, as the grain size scale of the first particles 121 is reduced, the number (proportion) of the first particles 121 is gradually increased. In the present invention, however, due to limitation of measuring equipment, the number (proportion) of the first particles 121 smaller than 200 nm or the modal value will be ignored.

However, the first grain size of the first particles 121 smaller than approximately 1 nm to approximately 200 nm means that the powder for forming the first particles 121 also has a smaller grain size than approximately 1 nm to approximately 200 nm. In this case, powder control is quite difficult to achieve. In addition, the first grain size of the first particles 121 larger than approximately 900 nm means that the light transmittance of the coating layer 120 starts to decrease.

In addition, the second grain size scale of the second particles 122 may be in the range of approximately 900 nm to approximately 10 μm, preferably in the range of approximately 900 nm to approximately 3 μm, and the second modal value of the second particles 122 may be in the range of approximately 1.0 μm to approximately 5.0 μm, preferably in the range of approximately 1.0 μm to approximately 1.2 μm, but aspects of the present invention are not limited thereto. As an example, the second modal value of the second particles 122 may be slightly smaller or larger than the numeral values stated above. However, the second grain size of the second particles 122 smaller than approximately 900 nm means that the laminating speed of the coating layer is reduced, and the second grain size of the second particles 122 larger than approximately 10 μm means that the light transmittance of the coating layer 120 is lowered, the porosity increases, and the internal structure of the coating layer 120 becomes unstable.

The second grain size scale of the second particles 122 is limited to 3 μm above due to limitation of measuring equipment, but aspects of the present invention are not limited thereto.

In addition, the first particles may also be referred to as first grains and the second particles may be referred to as second grains, the present invention is not limited to those terms used herein.

Meanwhile, the maximum number of first modal values may be approximately 2 to 10 times larger than that of second modal values, preferably 2 to 5 times.

In more detail, as illustrated in FIG. 5, the maximum number of first modal values in the first particles is approximately 40 in approximately 300 nm, and the maximum number of second modal values in the second particles is approximately 10 in approximately 1100 nm. That is to say, the maximum number of first modal values is approximately 4 times larger than that of second modal values, but aspects of the present invention are not limited thereto. In addition, the grain size scale for distinguishing the first particles from the second particles is approximately 900 nm, and the number of grain sizes in the grain size scale of approximately 900 nm is approximately 2 or 3. In other words, the number (proportion) of grain sizes in the grain size scale for distinguishing the first particles from the second particles is approximately 20 to 30% of the maximum number of second modal values.

In addition, if the proportion (the maximum number of first modal values being approximately 2 to 10 times, preferably approximately 2 to 5 times), is beyond the proportion stated above, for example, if the maximum number of first modal values is larger than the proportion stated above, the light transmittance of the coating layer may be improved, which is advantageous for realizing material characteristics, while the laminating speed of the coating layer is lowered. As another example, if the first modal values is smaller than the proportion stated above, the laminating speed of the coating layer is increased, the porosity becomes large, so that surface micro cracks become increased, making the coating layer unstable.

The porosity of the coating layer 120 formed by the forming method of the coating layer 120 may be in the range of approximately 0.01% to approximately 1.0%, preferably in the range of approximately 0.01% to approximately 0.2%. That is to say, the porosity is determined by the first grain size scale and first modal value of the first particles 121, the second grain size scale and second modal value of the second particles 122, and the numbers (proportions) of the first and second modal values of the first and second particles 121 and 122. If the numeral values are beyond the range stated above, the laminating speed of the coating layer 120 may be excessively reduced or the porosity may become excessively increased. That is to say, when the coating layer 120 formed by the forming method of the coating layer 120 has a porosity of approximately 0.01% to approximately 1.0%, the surface micro cracks become small, thereby stabilizing the microstructure of the coating layer 120.

Here, the porosity of the coating layer 120 is measured by the image processing software, which is well known to one skilled in the art and will not be described in detail.

In addition, the thickness of the coating layer 120 may be in the range of approximately 1 μm to approximately 100 μm. If the thickness of the coating layer 120 is smaller than approximately 1 μm, it is difficult for the base material 110 to be industrially used. In addition, if the thickness of the coating layer 120 is larger than approximately 100 μm, the light transmittance may be markedly reduced.

In addition, the light transmittance of the coating layer 120 may be adjusted to be in the range of approximately 1% to approximately 99%, and the light transmittance of the coating layer 120 may be controlled by the overall thickness of the coating layer 120, the first and second grain size scales and the first and second modal values of the first and second particles 121 and 122. As an example, assuming that the coating layer 120 has a uniform thickness and the maximum number of second modal values is fixed, the light transmittance may become larger according as the maximum number of first modal values of the first particles 121 among the first and second particles 121 and 122 is increased, and may become smaller according as the maximum number of first modal values of the first particles 121 is decreased. In addition, assuming that the maximum number of second modal values is fixed, the porosity may become smaller according as the maximum number of first modal values of the first particles 121 is increased and may become larger according as the maximum number of first modal values of the first particles 121 is decreased, regardless of the thickness of the coating layer 120.

Meanwhile, the cross-sectional ratio of the first particles 121 to the second particles 122 is in the range of 9:1 to 5:5, preferably in the range of 7.7:2.3. As described above, the cross-sectional area to be analyzed may be 110 μm$^2$. When the cross-sectional ratio of the first particles 121 to the second particles 122 is within the range stated above, the porosity may be relatively small, surface micro cracks are absent, the coating layer 120 is semitransparent and material characteristics can be easily realized. As an example, when the cross-sectional ratio of the first particles 121 to the second particles 122 is beyond the range stated above, that is, when the proportion of the first particles 121 is relatively large, the time taken to form/laminate the coating layer 120 may be extended, and when the proportion of the first particles 121 is relatively small, the porosity may increase. However, when the cross-sectional ratio of the first particles 121 to the second particles 122 is beyond the range stated above, that is, when the proportion of the second particles 122 is relatively large, the time taken to form/laminate the coating layer 120 may be shortened while increasing the porosity, and when the proportion of the second particles 122 is relatively small, the time taken to form/laminate the coating layer 120 may be extended.

As described above, the first particles 121 or the second particles 122 may be a brittle material or/and a flexible material.

In detail, the first particles 121 or the second particles 122, which are brittle materials, may include one element or a mixture of two elements selected from the group consisting of yttria ($Y_2O_3$), YAG ($Y_3Al_5O_{12}$), rare earth metal based (elements of element Nos. 57 to 71, including Y and Sc) oxide, alumina ($Al_2O_3$), bio glass, silicon dioxide ($SiO_2$), hydroxyapatite ($Ca_{10}(PO_4)_6(OH)_2$), titanium dioxide ($TiO_2$) and equivalents thereof, but aspects of the present invention are not limited thereto.

In more detail, the first particles 121 or the second particles 122 as a brittle material or a flexible material may include one element or a mixture of two elements selected from the group consisting of hydroxyapatite ($Ca_{10}(PO_4)_6(OH)_2$), calcium phosphate, bio glass, $Pb(Zr,Ti)O_3(PZT)$, alumina ($Al_2O_3$), titanium dioxide ($TiO_2$), zirconia ($ZrO_2$), yttria ($Y_2O_3$), yttria stabilized zirconia (YSZ), Dysprosia ($Dy_2O_3$), Gadolinia ($Gd_2O_3$), Ceria ($CeO_2$), Gadolinia doped Ceria (GDC), magnesia (MgO), barium titanate ($BaTiO_3$), nickel manganate ($NiMn_2O_4$), potassium sodium niobate ($KNaNbO_3$), bismuth potassium titanate ($BiKTiO_3$), bismuth sodium titanate ($BiNaTiO_3$), $CoFe_2O_4$, $NiFe_2O_4$, $BaFe_2O_4$, $NiZnFe_2O_4$, $ZnFe_2O_4$, $MnxCo_{3-x}O_4$ (where x is a solid number of 3 or less), bismuth ferrite ($BiFeO_3$), bismuth zinc niobate ($Bi_{1.5}Zn_1Nb_{1.5O7}$), lithium phosphate aluminum titanium glass ceramic, Li—La—Zr—O-based Garnet oxide, Li—La—Ti—O-based Perovskite oxide, La—Ni—O-based oxide, lithium iron phosphate, lithium-cobalt oxide, Li—Mn—O-based Spinel oxide (lithium manganese oxide), lithium phosphate aluminum gallium oxide, tungsten oxide, tin oxide, nickel acid lanthanum, lanthanum-strontium-manganese oxide, lanthanum-strontium-iron-cobalt oxide, silicate-based phosphor, SiAlON-based phosphor, aluminum nitride, silicon nitride, titanium nitride, AlON, silicon carbide, titanium carbide, tungsten carbide, magnesium boride, titanium boride, metal oxide-metal nitride mixture, metal oxide-metal carbide mixture, ceramic-polymer mixture, ceramic-metal mixture, nickel, copper, silicon, and equivalents thereof, but aspects of the present invention are not limited thereto.

Here, the hydroxyapatite may be one element or a mixtures of two elements selected from the group consisting of dicalcium phosphate dihydrate (DCPD) ($CaHPO_4.2H_2O$), dicalcium phosphate anhydrate (DCPA) ($CaHPO_4$), octacalcium phosphate (OCP) ($Ca_4H(PO_4)_3.5/2H_2O$), β-Tcalcium phosphate (β-TCP) (β-$Ca_3(PO_4)_2$), α-Tcalcium phosphate (α-TCP) (α-$Ca_3(PO_4)_2$), tetracalcium phosphate (Te-CP) ($Ca_4O(PO)_2$) and equivalents thereof, but aspects of the present invention are not limited thereto.

Here, the base material 110 may include one selected from the group consisting of glass, a metal, a plastic material, a polymer resin, ceramic and equivalents thereof, but aspects of the present invention are not limited thereto.

Figure 6A:
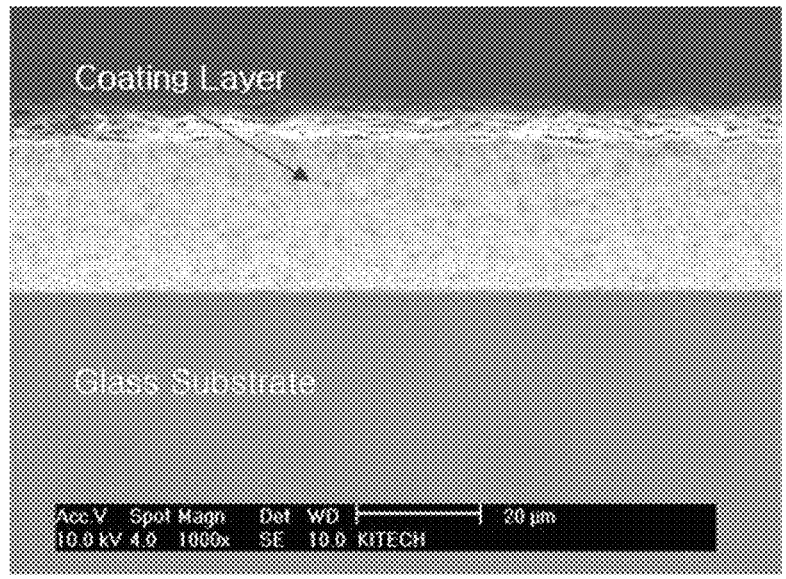
FIGS. 6A to 6C are SEM photographs of a plasma-resistant $Y_2O_3$ coating layer having a multi coating grain size according to an embodiment of the present invention.
Figure 6B:
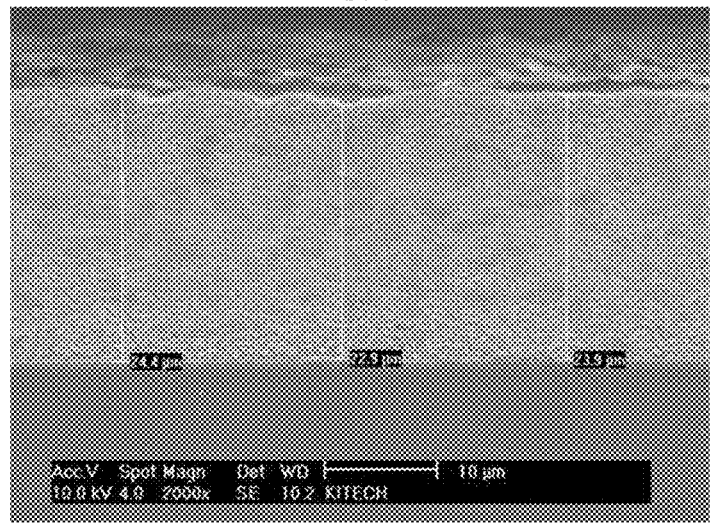
Figure 6C:
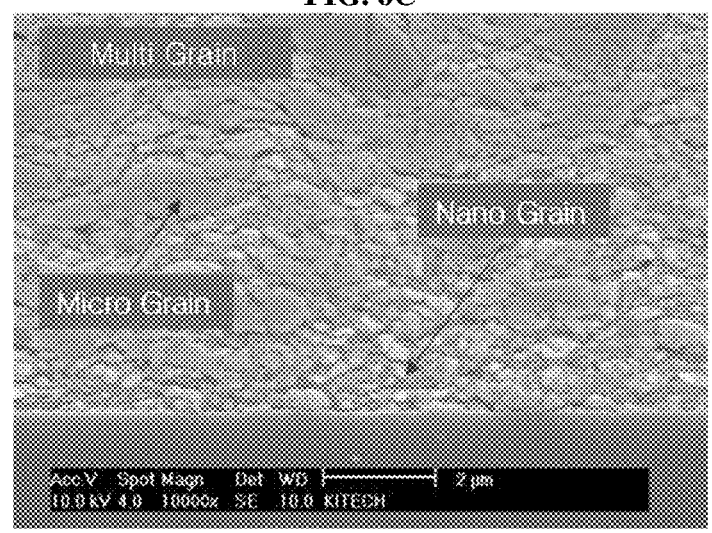
Figure 7A:
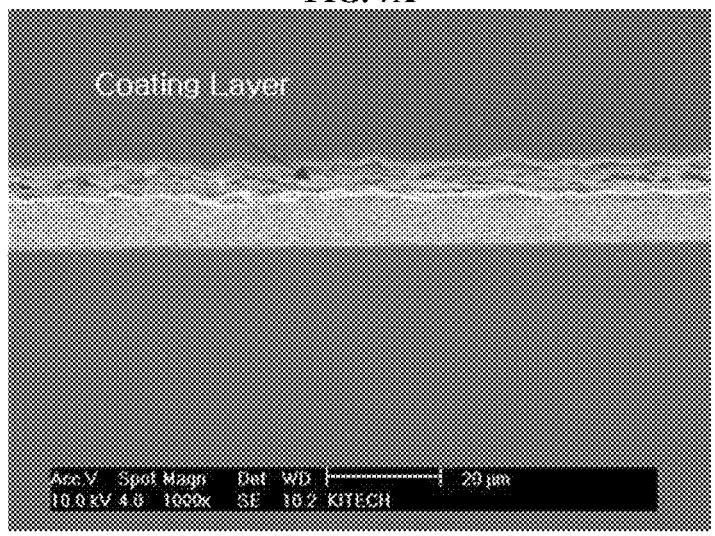
FIGS. 7A to 7C are SEM photographs of a bio ceramic hydroxyapatite $[Ca_{10}(PO_4)_6(OH)_2]$ coating layer having a multi coating grain size according to an embodiment of the present invention.
Figure 7B:
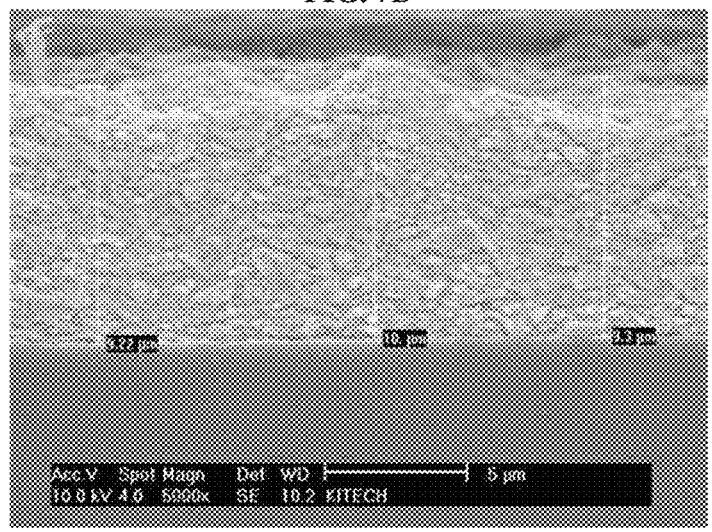
Figure 7C:
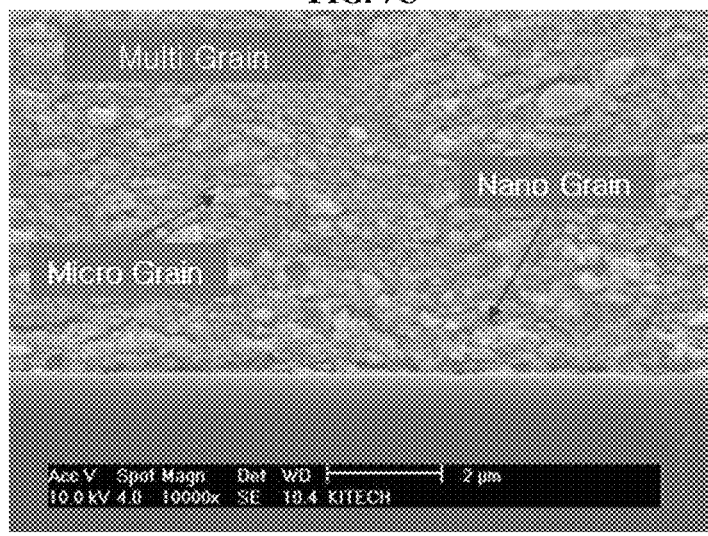
Figure 8A:
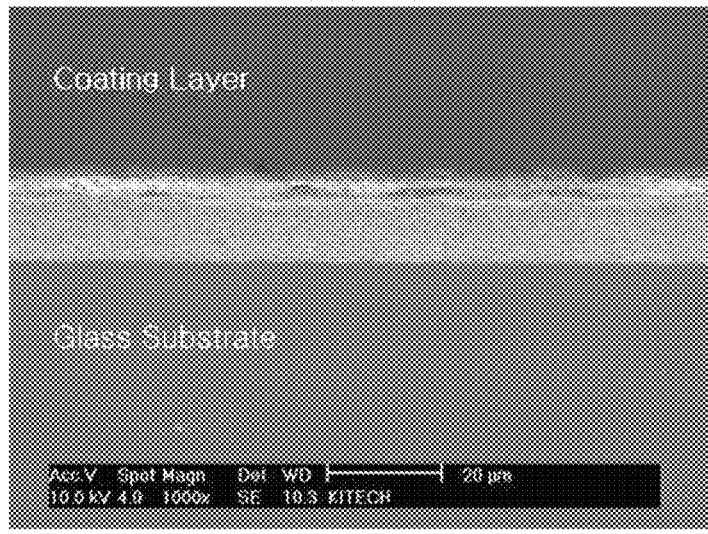
FIGS. 8A to 8C are SEM photographs of an insulating $Al_2O_3$ coating layer having a multi coating grain size according to an embodiment of the present invention.
Figure 8B:
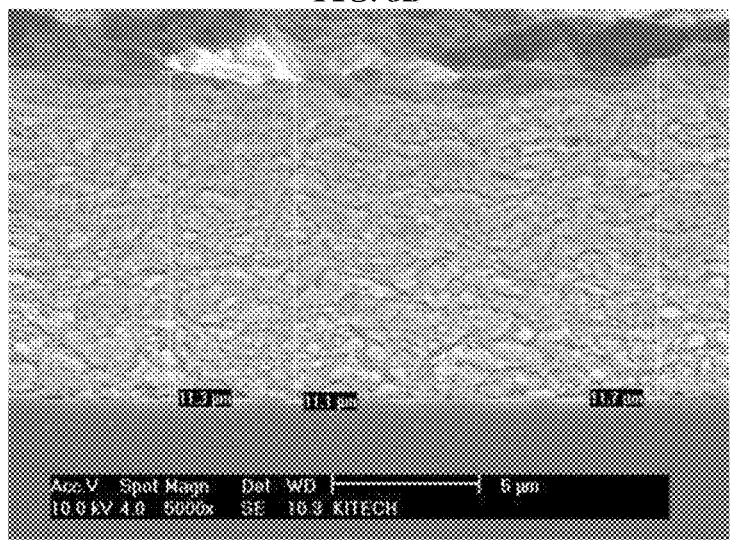
Figure 8C:
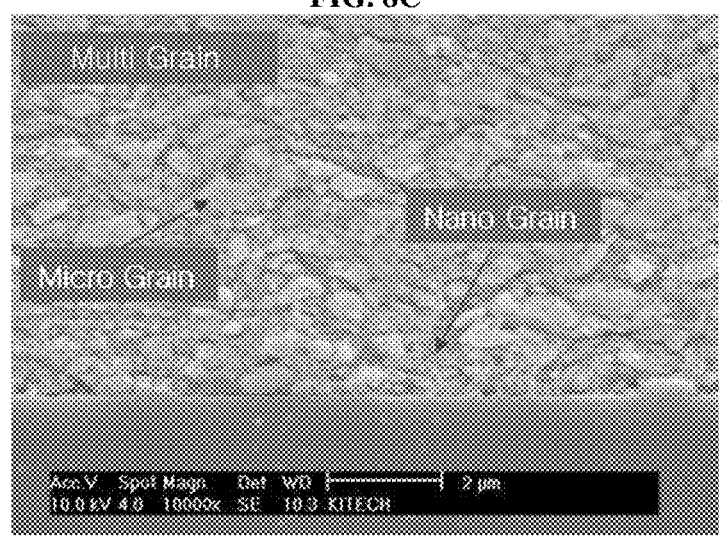

FIGS. 6A to 6C are SEM photographs of a plasma resistant $Y_2O_3$ coating layer having a multi coating grain size according to an embodiment of the present invention, FIGS. 7A to 7C are SEM photographs of a bio ceramic hydroxyapatite [$Ca_{10}(PO_4)_6(OH)_2$] coating layer having a multi coating grain size according to an embodiment of the present invention, and FIGS. 8A to 8C are SEM photographs of an insulating $Al_2O_3$ coating layer having a multi coating grain size according to an embodiment of the present invention.

In photographs shown in FIGS. 6A to 8C, portions indicated by "nano grain" mean the first particles hereto described and portions indicated by "micro grain" mean the second particles hereto described.

As confirmed from many photographs shown in the figures of FIGS. 6A to 8C, the first and second particles forming the coating layer according to the present invention may be configured by horizontally (left-to-right) elongated layers or laterally lying needles formed on a glass substrate, rather than circles or spheres. With this configuration, the porosity of the coating layer according to the present invention is markedly reduced and surface micro cracks are reduced, thereby providing a stable microstructure.

Therefore, in a semiconductor manufacturing process of a product employing the coating layer according to the present invention, for example, improved plasma resistance can be demonstrated, and a corrosion speed is retarded, thereby lowering the proportion of particles scattered in a semiconductor processing chamber.

In addition, while it has been described that the second particles have a second grain size of approximately 3 μm, which is due to limitation of analyzing equipment, one skilled in the art should appreciate that the second grain size of the second particles may be 10 μm or less.

As described above, according to the present invention, the first particles having a first grain size scale and a first modal value and the second particles having a second grain size scale larger than the first grain size scale and a second modal value larger than the first modal value coexist in a mixed state to form a coating layer, thereby achieving a base material having increased light transmittance (or translucency) while having a high laminating speed in forming the coating layer.

Moreover, since the first particles having a first grain size scale and a first modal value and the second particles having a second grain size scale and a second modal value are appropriately mixed to form the coating layer, a stable coating structure having a porosity of less than 1.0% (i.e., a highly compact coating structure) can be achieved while suppressing surface micro cracks.

In addition, according to the present invention, the stress of the coating layer formed on a surface of the base material can be easily adjusted to a desired value by adjusting the powder grain size scale and pressure differences.

Figure 9A:
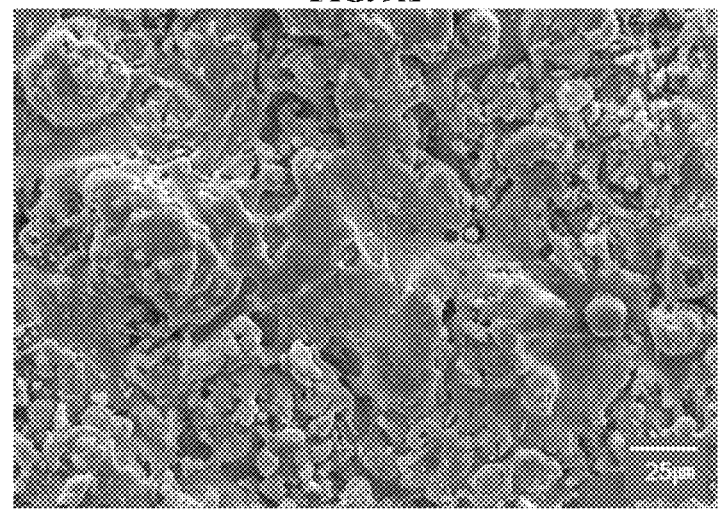
FIG. 9A is an SEM photograph of a plasma-resistant $Y_2O_3$ coating layer according to the prior art.
Figure 9B:
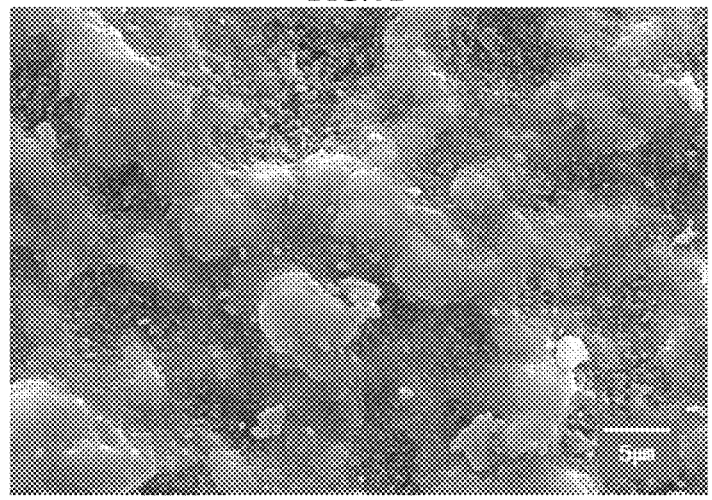
FIG. 9B is an SEM photograph of a plasma-resistant $Y_2O_3$ coating layer having a multi coating grain size according to an embodiment of the present invention.

FIG. 9A is an SEM photograph of a plasma resistant $Y_2O_3$ coating layer according to the prior art, and FIG. 9B is an SEM photograph of a plasma resistant $Y_2O_3$ coating layer having a multi coating grain size according to an embodiment of the present invention.

In more detail, FIG. 9A is an SEM photograph of a plasma resistant coating layer formed on a surface of a base material by atmosphere plasma spray (APS). In the APS, a plasma is generated by creating a gas condition inert to high energy of a DC discharge generated by applying a high voltage in the air. The plasma has heat energy having an ultrahigh temperature in the range of approximately 10,000° C. to approximately 20,000° C. In addition, the powder having a grain size scale in the range of approximately 30 μm to approximately 50 μm is exposed to the plasma having a ultrahigh temperature to be melted in the base material and to be sprayed to form the coating layer having a grain size scale in the range of approximately 5 μm to approximately 10 μm. However, the coating layer formed by APS may have a high porosity (e.g., 2 to 5%), as shown in FIG. 9A, due to an extremely rapid phase transition of the powder exposed to an ultrahigh temperature region and a non-uniform melting time, and many micro cracks may be generated due to high temperature collision of the plasma resistant coating layer. As described above, the plasma resistant coating layer formed by APS may have a high specific surface area and many micro cracks. Therefore, when the plasma resistant coating layer is employed to a semiconductor/display manufacturing process, particles of the plasma resistant coating may be corroded, resulting in contamination of processing parts and ultimately causing damages to a product of the semiconductor/display manufacturing process.

Meanwhile, as illustrated in FIG. 9B, the plasma resistant coating layer according to the present invention demonstrate compactness and a small specific surface area. As described above, the plasma resistant coating layer according to the present invention has a porosity in the range of approximately 0.01% to approximately 1.0%, which is much smaller than the conventional porosity. In other words, the plasma resistant coating layer according to the present invention has a compactness range in the range of approximately 99% to approximately 99.99%, which is much smaller than the conventional compactness ratio. Therefore, the plasma resistant coating layer according to the present invention has much higher plasma resistance than the prior art plasma resistant coating layer.

Table 1 shows comparison results of various physical properties of the plasma resistant coating layer according to the prior art by APS and the plasma resistant coating layer according to the present invention.

TABLE 1

|  | Prior Art (APS) | Present Invention |
|---|---|---|
| Hardness | 1~2 GPa | 9~13 GPa |
| Adhesion strength | 5~6 MPa | 70~90 MPa |
| Porosity | 2~4% | 0.01~1.0% |
| Withstand voltage | 10~20 V/μm | 80~120 V/μm |

As listed in Table 1, whereas the prior art plasma resistant coating layer had a hardness of 1 to 2 GPa, the plasma resistant coating layer according to the present invention had a hardness of 9 to 13 Gpa. In addition, whereas the prior art plasma resistant coating layer had an adhesion strength of 5 to 6 MPa, the plasma resistant coating layer according to the present invention had an adhesion strength of 70 to 90 MPa. In addition, whereas the prior art plasma resistant coating layer had a porosity of 2 to 4%, the plasma resistant coating layer according to the present invention had a porosity of 0.01 to 1.0%. Finally, whereas the prior art plasma resistant coating layer had a withstand voltage of 10 to 20 V/μm, the plasma resistant coating layer according to the present invention had a withstand voltage of 80 to 120 V/μm.

As described above, compared to the prior art, the present invention provides the plasma resistant coating layer having a multi coating grain size is superior in view of hardness, adhesion strength, porosity and withstand voltage. Accordingly, the plasma resistant coating layer has improved plasma resistance under a plasma environment.

Here, the hardness is measured by a mark created by pressing the plasma resistant coating layer using a diamond quadrangular pyramid tool, the adhesion strength is measured by pulling the plasma resistant coating formed on a base material using a rod cell, the withstand voltage is measured by installing two electrodes on the plasma resistant coating layer, and the porosity is measured by obtaining an image obtained by cutting the plasma resistant coating layer, photographing the cut plasma resistant coating layer and analyzing the image using a computer having image processing software. Since the measuring methods are widely well known to one skilled in the art, detailed descriptions thereof will not be given.

Meanwhile, the base material on which the plasma resistant coating layer according to the present invention is formed may be a part exposed to the plasma environment. That is to say, the part may be an internal part of the processing chamber for manufacturing semiconductors or displays. In more detail, the part may include one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, a mask frame and equivalents thereof. However, the present invention does not limit the base material or part on which the plasma resistant coating layer is formed to those listed herein.

Figure 10A:
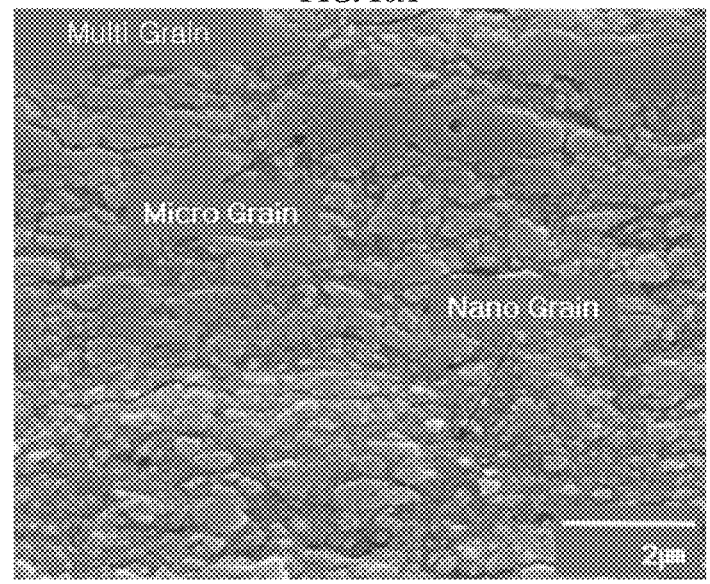
FIG. 10A is an SEM photograph illustrating a cross section of a bio ceramic hydroxyapatite $[Ca_{10}(PO_4)_6(OH)_2]$ coating layer having a multi coating grain size according to an embodiment of the present invention.
Figure 10B:
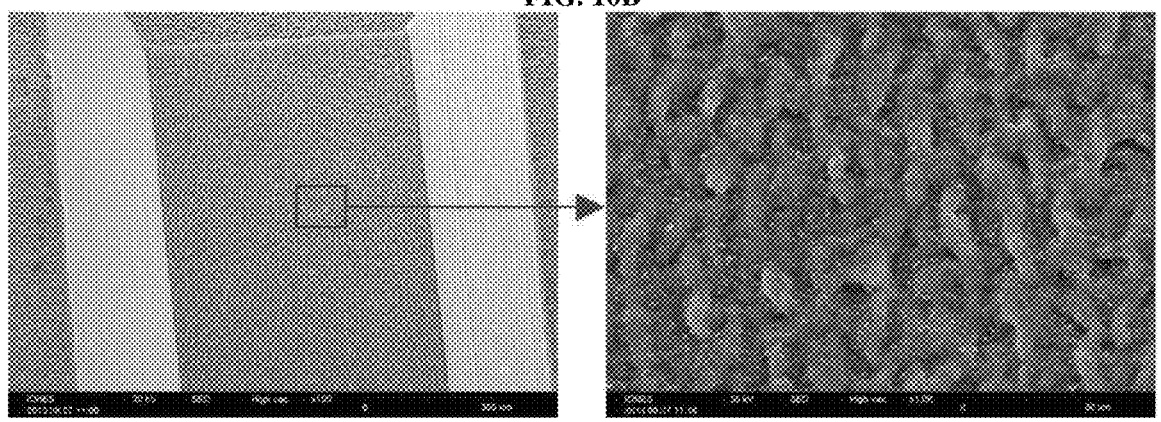
FIG. 10B is an SEM photograph illustrating a surface of a bio ceramic coating layer formed on a fixture for an implant.
Figure 10C:
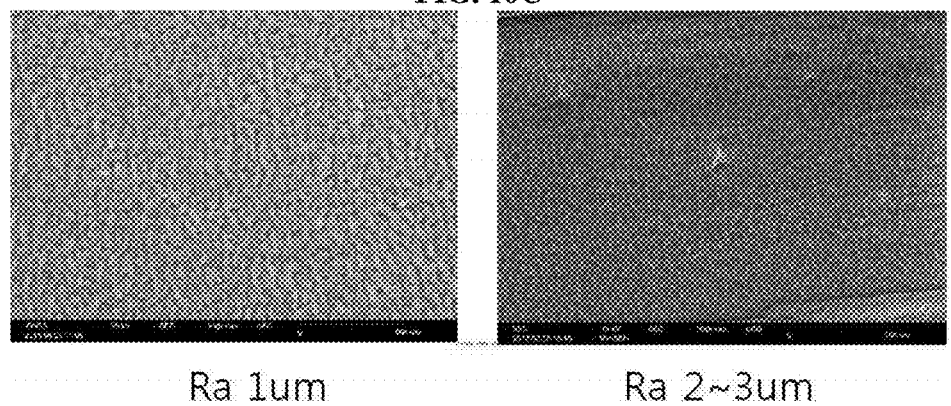
FIG. 10C is an SEM photograph illustrating surfaces of various bio ceramic coating layers.

FIG. 10A is an SEM photograph illustrating a cross section of a bio ceramic hydroxyapatite $[Ca_{10}(PO_4)_6(OH)_2]$ coating layer having a multi coating grain size according to an embodiment of the present invention, FIG. 10B is an SEM photograph illustrating a surface of a bio ceramic coating layer formed on a fixture for an implant, and FIG. 10C is an SEM photograph illustrating surfaces of various bio ceramic coating layers.

In the photograph shown in FIG. 10A, portions indicated by "nano grain" mean the first bio ceramic particles hereto described and portions indicated by "micro grain" mean the second bio ceramic particles hereto described.

As confirmed from the photograph shown in FIG. 10A, the first and second bio ceramic particles forming the bio ceramic coating layer according to the present invention may be configured by horizontally (left-to-right) elongated layers or laterally lying needles formed on a glass substrate, rather than circles or spheres. With this configuration, the porosity of the bio ceramic coating layer according to the present invention is markedly reduced and surface micro cracks are reduced, thereby providing a stable microstructure.

As illustrated in FIGS. 10B and 10C, the bio ceramic coating layer according to the present invention may be formed on a surface of a fixture for a dental implant and may have a constant surface roughness. As an example, as shown in FIG. 10C, the arithmetic roughness (Ra) of the bio ceramic coating layer may be adjusted to be in the range of approximately 1 or 2 μm to approximately 3 μm. As described above, the bio ceramic coating layer according to the present invention may have an increased surface area, thereby increasing the degree of bio activation.

The surface roughness or the arithmetic roughness (Ra) of the bio ceramic coating layer may be adjusted by controlling an angle between a nozzle for spraying bio ceramic powder and a base material on which the coating layer is coated, a rotating speed of a rotating device for rotating the base material. As described above, since the coating layer needs to be formed on a 3D fixture for a dental implant, a rotating device for rotating the 3D fixture for a dental implant is installed within the processing chamber.

Table 2 lists nano indentation hardness and elasticity moduli data of the bio ceramic coating layer having a multi coating grain size according to an embodiment of the present invention and the prior art bio ceramic coating layer.

TABLE 2

|  | Nano Indentation Hardness (GPa) | Modulus of Elasticity (GPa) |
|---|---|---|
| Present Invention | 5 | 82 |
| Prior Art | 1.5 | 50 |

Since the measuring methods of the nano indentation hardness are widely well known to one skilled in the art, a detailed description thereof will not be given. In addition, since the measuring methods of the modulus of elasticity are also widely well known to one skilled in the art, a detailed description thereof will not be given.

As listed in Table 2, whereas the prior art bio ceramic coating layer (based on pulse laser deposition, for example) had a nano indentation hardness of approximately 1.5 GPa, the bio ceramic coating layer according to the present invention had a nano indentation hardness of approximately 5 GPa. Therefore, the bio ceramic coating layer according to the present invention has higher mechanical strength than the prior art bio ceramic coating layer.

In addition, as listed in Table 2, whereas the prior art bio ceramic coating layer (based on pulse laser deposition, for example) had a modulus of elasticity of approximately 50 GPa, the bio ceramic coating layer according to the present invention had a modulus of elasticity of approximately 82 GPa. Therefore, the bio ceramic coating layer according to the present invention has higher shock resistance than the prior art bio ceramic coating layer. That is to say, the bio ceramic coating layer according to the present invention tends to break easily by external shocks.

Meanwhile, in Vickers hardness comparison of the coating layer according to the present invention and the prior art plasma spray coating layer, the coating layer according to the present invention has a hardness of approximately 480 HV and the prior art plasma spray coating layer has a hardness in the range of approximately 450 to 500 HV.

In addition, the bio ceramic bulk (sintered at approximately 1300° C.) has a modulus of elasticity of approximately 80 GPa and the prior art plasma spray coating layer has a modulus of elasticity of approximately 40 GPa. Therefore, the bio ceramic coating layer according to the present invention has a higher modulus of elasticity than the sintered bulk.

As described above, whereas it is difficult to form a compact bio ceramic coating layer according to the prior art, the coating layer having a multi coating grain size is formed according to the present invention, thereby achieving an increased surface area and excellent mechanical strength and shock resistance.

Figure 11A:
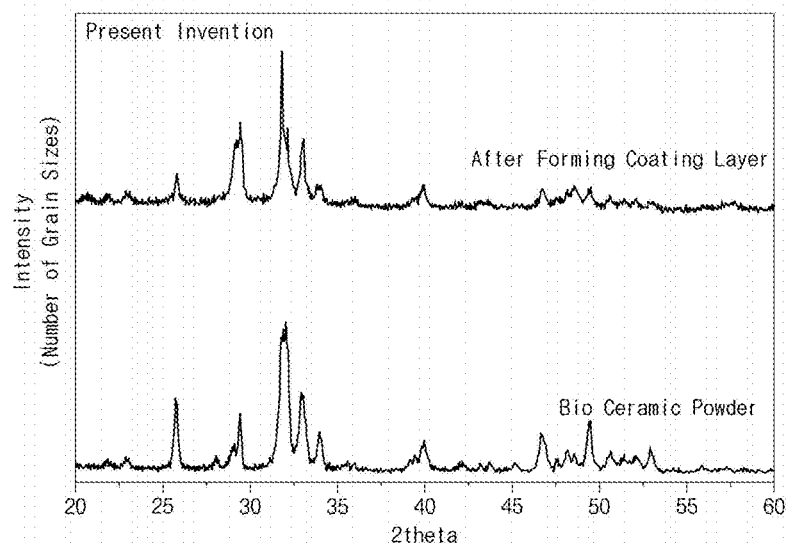
FIGS. 11A and 11B are graphs showing analysis results of X-ray crystallography performed on a bio ceramic hydroxyapatite [Ca10(PO4)6(OH)2] coating layer having a multi coating grain size according to an embodiment of the present invention and a prior art bio ceramic coating layer.
Figure 11B:
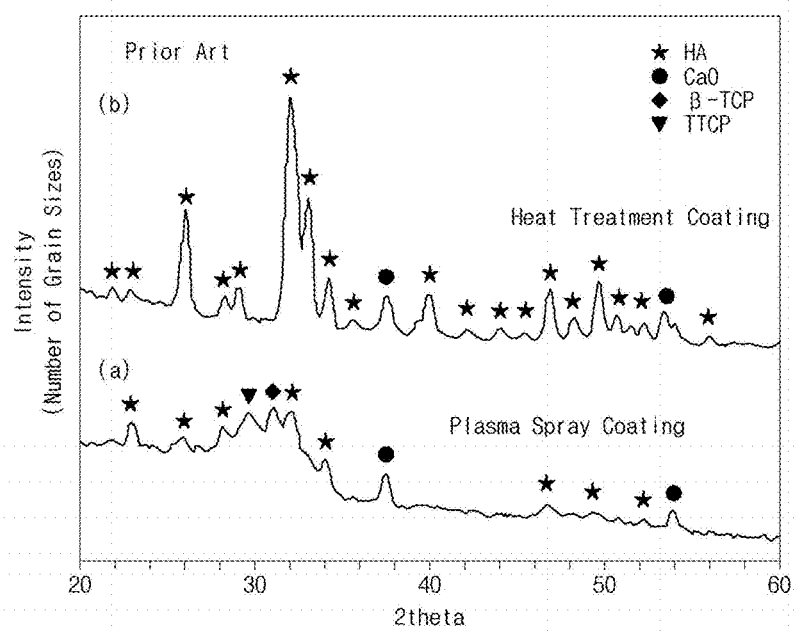

FIGS. 11A and 11B are graphs showing analysis results of X-ray crystallography performed on a bio ceramic hydroxyapatite $[Ca_{10}(PO_4)_6(OH)_2]$ coating layer having a multi coating grain size according to an embodiment of the present invention and a prior art bio ceramic coating layer.

As illustrated in FIG. 11A, when the bio ceramic powder according to the present invention and the coating layer formed using the powder were analyzed by X-ray crystallography, they demonstrated almost the same peak value. Moreover, although not shown, when the coating layer according to the present invention was heat-treated at a temperature of approximately 700° C., it had almost the same peak value with the bio ceramic powder and/or the untreated coating layer.

However, as illustrated in FIG. 11B, according to the prior art (e.g., plasma spray coating), after forming/laminating the bio ceramic coating layer, phase transition severely occurred. That is to say, after forming the bio ceramic coating layer, hydroxyapatite was subjected to phase transition, so that the amount of hydroxyapatite was reduced while increasing the amounts of calcium oxide (CaO) and tetracalciu phosphate (TTCP).

In order to increase the amount of hydroxyapatite in the prior art, heat treatment is necessarily performed, so that the processing time may be extended and the manufacturing cost may increase. That is to say, as illustrated in FIG. 11B, after the heat treatment, the amount of calcium oxide was reduced and the amount of hydroxyapatite was again increased.

Figure 12A:
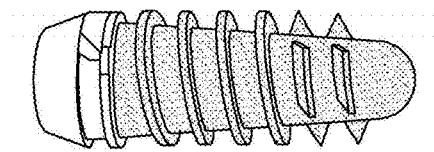
FIGS. 12A and 12B illustrate examples of a fixture for an implant including a bio ceramic hydroxyapatite $[Ca_{10}(PO_4)_6(OH)_2]$ coating layer having a multi coating grain size according to an embodiment of the present invention.
Figure 12B:
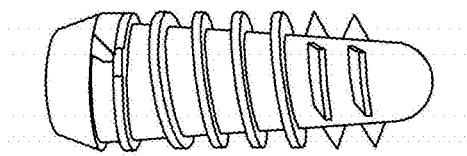

FIGS. 12A and 12B illustrate examples of a fixture for an implant including a bio ceramic hydroxyapatite $[Ca_{10}(PO_4)_6(OH)_2]$ coating layer having a multi coating grain size according to an embodiment of the present invention.

As illustrated in FIG. 12A, when the bio ceramic coating layer having a multi coating grain size according to the present invention was formed on a fixture for an implant, the color of the bio ceramic coating layer was generally black. However, since black is not a color preferred by patients or doctors, as illustrated in FIG. 12B, a white bio ceramic coating layer was formed on the fixture for an implant in the present invention.

To this end, according to the present invention, the white bio ceramic coating layer shown in FIG. 11B was formed using the powder obtained by homogenously mixing titanium oxide and hydroxyapatite with each other, and the aforementioned device and method, thereby enhancing psychological stability of patients and doctors exploiting medical equipment employing the bio ceramic coating layer.

Figure 13A:
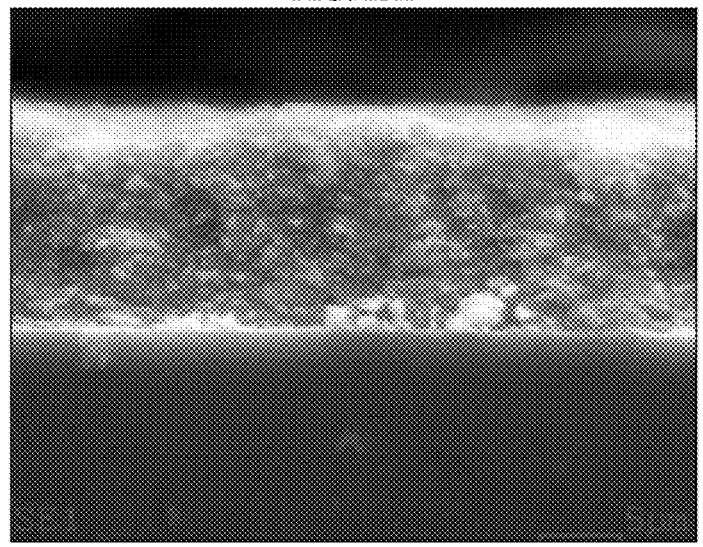
FIG. 13A is an SEM photograph illustrating a cross section of a fixture for an implant including a bio ceramic coating layer having a multi coating grain size according to an embodiment of the present invention.

FIG. 13A is an SEM photograph illustrating a cross section of a fixture for an implant including a bio ceramic coating layer having a multi coating grain size according to an embodiment of the present invention, and FIGS. 13B to 13E are SEM photographs showing analysis results of various parts of the bio ceramic coating layer illustrated in FIG. 13A.

As illustrated in FIG. 13A, the fixture for an implant was used as the base material and a bio ceramic coating layer (made of a mixture of hydroxyapatite and titanium oxide) having a predetermined thickness was formed thereon.

Figure 13B:
FIGS. 13B to 13E are SEM photographs showing analysis results of various components of the bio ceramic coating layer illustrated in FIG. 13A.
Figure 13C:
Figure 13D:
Figure 13E:

As illustrated in FIG. 13B, phosphorus (P) components were uniformly distributed in the coating layer. As illustrated in FIG. 13C, calcium (Ca) components were uniformly distributed in the coating layer. As illustrated in FIG. 13D, titanium (Ti) components were uniformly distributed in the coating layer. As illustrated in FIG. 13E, oxygen (O) components were uniformly distributed in the coating layer.

That is to say, according to the present invention, the bio ceramic coating layer having hydroxyapatite and titanium oxide uniformly distributed therein can be obtained.

While the fixture for an implant is exemplified as a base material in the bio ceramic coating layer according to the present invention, instrument inserted into human body can also be used as the base material. As an example, not only the fixture for an implant but an artificial joint or an equivalent thereof may also be used as the base material.

Table 3 lists data of adhesion strength data (surface binding force or tensile strength) of the bio ceramic coating layer according to the present invention and the prior art bio ceramic coating layer. As listed in Table 3, the coating layer according to the present invention has improved adhesion strength, compared to the prior art bio ceramic coating layer. Therefore, unlike the prior art bio ceramic coating layer, the bio ceramic coating layer according to the present invention is not readily peeled off from the fixture for an implant or the instrument inserted into human body, such as an artificial joint.

TABLE 3

|  | Present Invention | Prior Art |
|---|---|---|
| Adhesion Strength | 30 MPa | 15 MPa |

A method of measuring the adhesion strength will now be described. First, as an example, a bio ceramic coating layer (HA) is deposited on a titanium substrate, an epoxy adhesive is coated on an upper level of the coating layer to adhere the coating layer to a jig for measuring the adhesion strength. Thereafter, a universal testing machine (RB-302ML) is used as analyzing equipment to measure the adhesion strength with the maximum load of 450 Kgf/cm$^2$ at a rate of 1 mm/min. Here, the prior art bio ceramic coating layer means a bio ceramic coating layer formed by plasma spray coating.

As described above, according to the present invention, since a deposition process can be performed at room temperature, rather than at high temperature, calcium (Ca) and phosphorus (P) are not separated from the bio ceramic (e.g., hydroxyapatite) coating layer. In addition, heat treatment, which is an essential process in the prior art, may be skipped. That is to say, according to the present invention, the purity and crystallinity of the bio ceramic coating layer may maintain material characteristics.

In addition, in the present invention, the surface roughness or the arithmetic roughness (Ra) may be adjusted by controlling an angle between a nozzle for spraying bio ceramic powder and a base material on which the coating layer is coated, a rotating speed of a rotating device for rotating the base material. Therefore, in the present invention, owing to surface roughness and an increased surface area, the degree of bio activation can be increased.

Figure 14:
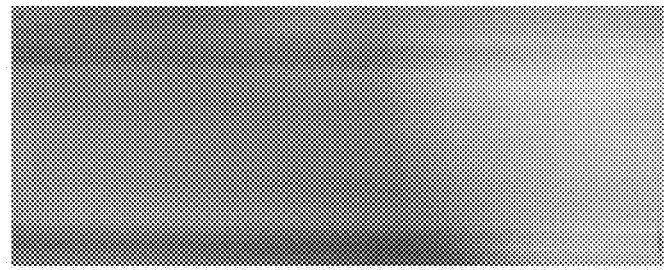
FIG. 14 is a photograph illustrating an insulating $Al_2O_3$ coating layer having a multi coating grain size according to an embodiment of the present invention, which is formed on a copper base material.

FIG. 14 is a photograph illustrating an insulating Al2O3 coating layer having a multi coating grain size according to an embodiment of the present invention, which is formed on a copper base material.

Here, the copper base material may include, for example, the base material is a part exposed to a plasma environment, instrument inserted into human body, a substrate or a heat sink for a light emitting diode (LED), a substrate or a heat sink for an electronic control unit (ECU) of a vehicle, a substrate or a heat sink for a spark module of a vehicle, a substrate or a heat sink for a power semiconductor module, a substrate or a heat sink for a power converter, or a heat dissipating substrate for a fuel cell, but aspects of the present invention are not limited thereto.

In addition, the insulating coating layer formed on the copper base material, as described above, may be alumina (Al$_2$O$_3$), and the maximum thickness of the insulating coating layer may be 45 μm.

As illustrated in FIG. 14, the insulating coating layer was semi-transparently formed on the copper base material. In addition, it was confirmed that the insulating coating layer was not readily peeled off from the copper base material.

In addition, when the insulating coating layer according to the present invention was compared with the insulating coating layer formed by plasma spray coating in view of Vickers hardness, the insulating coating layer according to the present invention had a hardness of approximately 714 HV, whereas the prior art coating layer based on plasma spray coating had a hardness in the range of approximately 450 HV to approximately 500 HV. In addition, the insulating coating layer according to the present invention had a modulus of elasticity of approximately 152 GPa, whereas the prior art coating layer had a modulus of elasticity of approximately 50 GPa. Therefore, the insulating coating layer according to the present invention had higher shock resistance than the prior art insulating coating layer. That is to say, the insulating coating layer according to the present invention was not readily break by external shocks.

Table 4 lists data of adhesion strength data (surface binding force or tensile strength) of the insulating coating layer according to the present invention and the prior art insulating coating layer. As listed in Table 4, the insulating coating layer according to the present invention has improved adhesion strength, compared to the prior art insulating coating layer. Therefore, unlike the prior art insulating coating layer, the insulating coating layer according to the present invention is not readily peeled off from the base material.

TABLE 4

|  | Present Invention | Prior Art |
| --- | --- | --- |
| Adhesion strength | 26 MPa | 15 MPa |

A method of measuring the adhesion strength will now be described. First, as an example, an insulating coating layer is deposited on a copper substrate, an epoxy adhesive is coated on an upper level of the coating layer to adhere the coating layer to a jig for measuring the adhesion strength. Thereafter, a universal testing machine (RB-302ML) is used as analyzing equipment to measure the adhesion strength with the maximum load of 450 Kgf/cm$^2$ at a rate of 1 mm/min. Here, the prior art insulating coating layer means an insulating coating layer formed by plasma spray coating.

Figure 15:
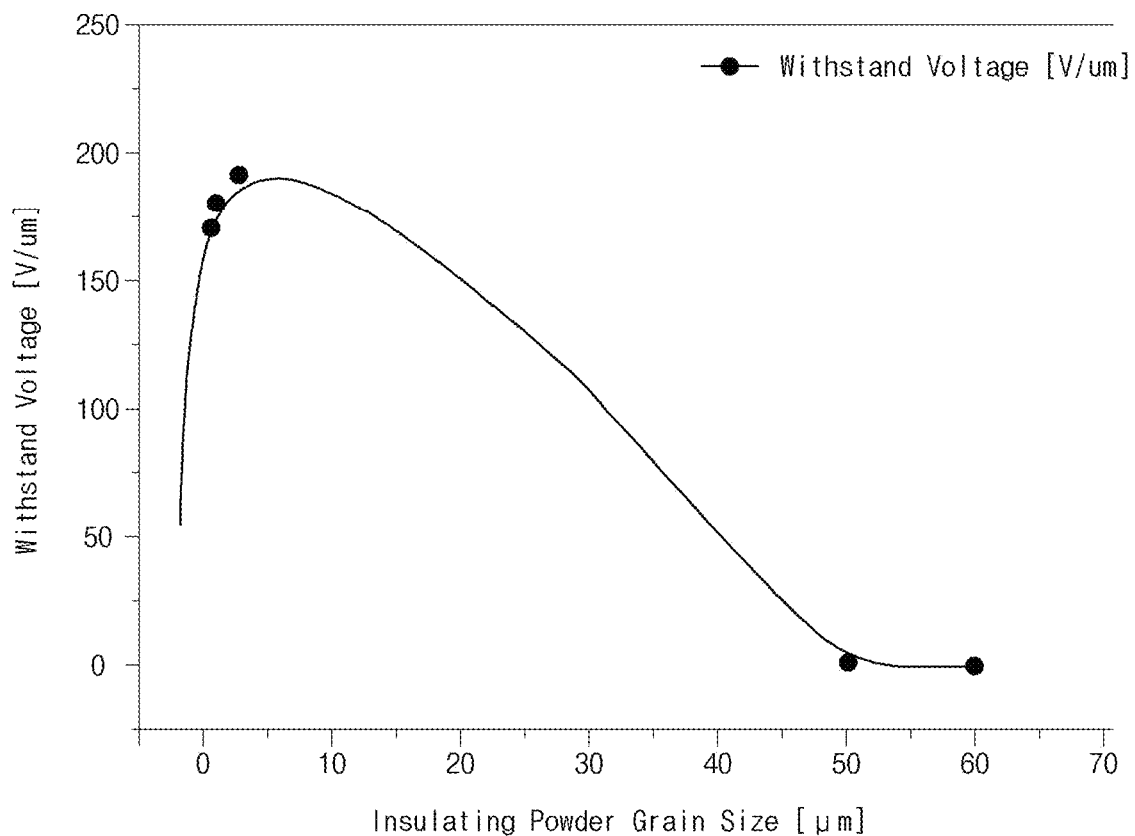
FIG. 15 is a graph showing withstand voltages of an insulating powder coating layer stacked by grain sizes.

FIG. 15 is a graph showing withstand voltages of an insulating powder coating layer stacked by grain sizes. In FIG. 15, the X axis indicates insulating powder grain size (μm), and the Y axis indicates the withstand voltage [V/μm]. In addition, Table 5 summarizes insulating powder grain sizes, insulating coating layer thicknesses and withstand voltages.

TABLE 5

| Powder grain size [μm] | Coating thickness [μm] | Withstand voltage [V/μm] |
| --- | --- | --- |
| 0.5 | 3.6 | 170 |
| 1.0 | 9.8 | 183 |
| 4.0 | 22.5 | 195 |
| 48.9 | 0 | 0 |
| 62.5 | 0 | 0 |

As shown in FIG. 15 and Table 5, when the insulating powder grain size was 0.5 μm, the insulating coating layer had a thickness of 3.6 μm and a withstand voltage of 170 V/μm. In addition, when the insulating powder grain size was 1.0 μm, the insulating coating layer had a thickness of 9.8 μm and a withstand voltage of 183 Vim. In addition, when the insulating powder grain size was 4 μm, the insulating coating layer had a thickness of 22.5 μm and a withstand voltage of 195 V/μm. In addition, when the insulating powder grain sizes were 48.8 μm and 62.5 μm, no insulating coating layer was formed, so that a withstand voltage could not be measured. Here, the respective insulating coating layers were formed for the same duration of time.

As described above, according to the present invention, when the insulating powder has a grain size of 4.0 μm, the insulating coating layer having the maximum thickness of 22.5 μm was obtained for the same duration of time. At this time, the insulating coating layer had the highest withstand voltage of 195 V/μm. Meanwhile, the formed insulating coating layer had photograph images shown in FIGS. 8B and 8C. As shown in FIGS. 8B and 8C, the insulating coating layer having a multi coating grain size according to the present invention enables thick layer deposition and has a high withstand voltage characteristic.

Practically, insulating powder grain sizes were measured as 0.5 µm, 1.0 µm, 4.0 µm, 48.8 µm and 62.5 µm, the insulating powder grains were sprayed to the base material for the same duration of time to form/laminate the insulating coating layer, whose thickness was measured as 0.36 µm, 9.8 µm, 22.5 µm, 0 µm and 0 µm, respectively. That is to say, when the insulating powder grain size was approximately 4.0 µm, the insulating coating layer having the maximum thickness of 22.5 µm was obtained. In addition, when the insulating powder grain sizes were 0.5 µm and 1.0 µm, the thicknesses of the laminated/formed insulating coating layers were relatively small, that is, 0.36 µm and 9.8 µm. When the insulating powder grain sizes were 48.8 µm and 62.5 µm, no insulating coating layer was formed.

Figure 16A:
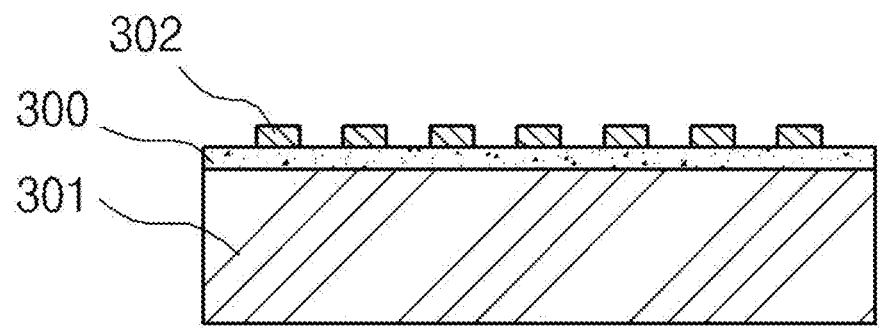
FIGS. 16A and 16B are cross-sectional views of a substrate and a heat sink, in which an insulating coating layer and patterns according to an embodiment of the present invention.
Figure 16B:
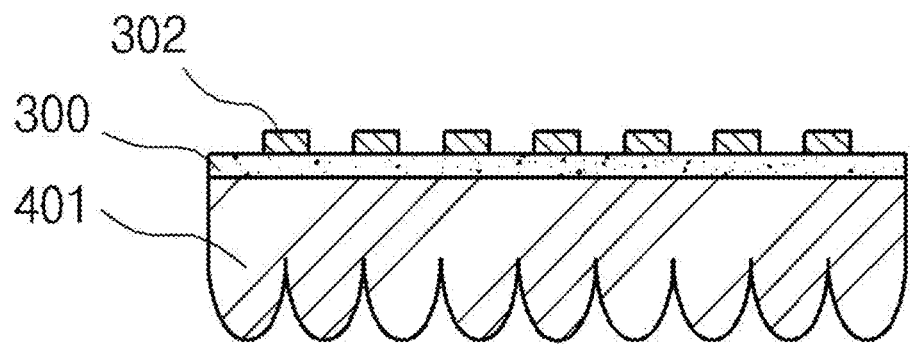

FIGS. 16A and 16B are cross-sectional views of a substrate and a heat sink, in which an insulating coating layer and patterns according to an embodiment of the present invention.

As illustrated in FIGS. 16A and 16B, the base material may be a substrate 301 made of a metal such as copper and/or aluminum, or a ceramic, or a heat sink 401, an insulating coating layer 300 having a predetermined thickness according to the present invention may be formed on a surface of the base material. That is to say, the insulating coating layer 300 may be formed on a surface of the substrate 301 or may be directly formed on a surface of the heat sink 401. In addition, a plurality of conductive patterns 302 may be formed on the insulating coating layer 300.

Here, the insulating coating layer according to the present invention has a thickness in the range of approximately 1 µm to approximately 50 µm, a porosity in the range of approximately 0.01% to approximately 1.0%. At this time, the measured withstand voltage was approximately 195 V/µm.

As described above, if the thickness of the insulating coating layer is smaller than approximately 50 µm and the porosity of the insulating coating layer is in the range of approximately 0.01% to approximately 1.0%, the substrate or the heat sink has better heat dissipation performance than in the prior art. In other words, if the thickness of the insulating coating layer is greater than approximately 50 µm and the porosity of the insulating coating layer is beyond 1.0%, the heat dissipation performance of the substrate or the heat sink is markedly lowered, like in the prior art. Therefore, the heat dissipation performance of the light emitting diode (LED), the electronic control unit (ECU) of a vehicle, the spark module of a vehicle, the power semiconductor module, the power converter, or the fuel cell, may also be lowered. However, in the present invention, the above stated problems do not arise.

In addition, since the withstand voltage of the insulating coating layer according to the present invention is increased to 195 V/µm, an amount of current flowing to the conductive patterns formed on the insulating coating layer may increase. In other words, if the withstand voltage of the insulating coating layer is smaller than 195 V/µm, the current performance (high current flowing capability) of the light emitting diode (LED), the electronic control unit (ECU) of a vehicle, the spark module of a vehicle, the power semiconductor module, the power converter, or the fuel cell, may also be lowered. However, in the present invention, the above stated problems do not arise.

In other words, in the prior art, in order to improve the withstand voltage, an insulating coating layer having a greater thickness than 50 µm was directly attached to a base material using an adhesive agent. Alternatively, a multi-layered insulating coating layer was formed on a base material using different kinds of materials. In such a case, however, the withstand voltage of the insulating coating layer is improved, while the overall thickness of the insulating coating layer is increased, thereby markedly lowering the heat dissipation performance.

However, in the present invention, the first insulating particles having a first grain size scale and a first modal value and the second insulating particles having a second grain size scale larger than the first grain size scale and a second modal value larger than the first modal value coexist in a mixed state to form an insulating coating layer, thereby improving the withstand voltage characteristic in spite of a relatively small thickness. In addition, according to the present invention, an amount of current flowing to the conductive patterns is increased and heat dissipation performance is improved.

While the forming method of a coating layer having a multi coating grain size and the coating layer thereof according to the present invention have been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present can be applied to a plasma resistant coating layer, a bio ceramic coating layer and/or an insulating coating layer.

The invention claimed is:

1. A coating layer formed using powder having a powder grain size ranging from 0.1 µm to 50 µm, the coating layer comprising:
   multiple first particles having a first coating grain size; and
   multiple second particles having a second coating grain size,
   wherein the multiple first and second particles are mixed to then be coated on a base material to form the coating layer, the first coating grain size of the first particles ranges from 200 nm to 900 nm, the second coating grain size of the second particles ranges from 900 nm to 10 µm, wherein the multiple first particles and the multiple second particles are electrically non-conductive.

2. The coating layer of claim 1, wherein the porosity of the coating layer is in the range of 0.01% to 1.0 µm.

3. The coating layer of claim 1, wherein the cross-sectional ratio of the first particles to the second particles is in the range of 9:1 to 5:5.

4. The coating layer of claim 1, wherein the powder is a brittle material or a flexible material.

5. The coating layer of claim 1, wherein the first and second particles include one element selected from the group consisting of yttrium-based oxide, $Y_2O_3$—$Al_2O_3$-based compound, AlN, $Si_3N_4$, TiN, $B_4C$, $ZrO_2$, $Al_2O_3$, $Ca_{10}(PO_4)_6(OH)_2$, bio glass, crystallized glass precipitated in a glass matrix by heat treatment and titanium dioxide.

6. The coating layer of claim 1, wherein the base material is a component exposed to a plasma environment, instrument inserted into human body, a substrate or a heat sink for a light emitting diode (LED), a substrate or a heat sink for an electronic control unit (ECU) of a vehicle, a substrate or a heat sink for a spark module of a vehicle, a substrate or a heat sink for a power semiconductor module, a substrate or a heat sink for a power converter, or a heat dissipating substrate for a fuel cell.

7. The coating layer of claim 6, wherein the component is an internal component of a processing chamber for manufacturing a semiconductor or a display.

8. The coating layer of claim 7, wherein the component includes one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, a mask frame and equivalents thereof.

9. The coating layer of claim 6, wherein the instrument inserted into human body is a fixture for an implant or an artificial joint.

10. The coating layer of claim 1, wherein a first modal value of the first particles exists between 250 nm and 350 nm in the first grain size scale and a second modal value of the second particles exists between 1.0 μm and 1.2 μm in the second grain size scale.

\* \* \* \* \*